United States Patent
Kinstle, III

(10) Patent No.: US 9,645,619 B2
(45) Date of Patent: May 9, 2017

(54) MICRO HEAT PIPE COOLING SYSTEM

(71) Applicant: Corsair Memory, Inc., Fremont, CA (US)

(72) Inventor: Robert Michael Kinstle, III, Livermore, CA (US)

(73) Assignee: Corsair Memory, Inc., Fremont, CA (US)

( * ) Notice: Subject to any disclaimer, the term of this patent is extended or adjusted under 35 U.S.C. 154(b) by 0 days.

(21) Appl. No.: 14/726,354

(22) Filed: May 29, 2015

(65) Prior Publication Data
US 2016/0349809 A1    Dec. 1, 2016

(51) Int. Cl.
*H05K 7/20* (2006.01)
*G06F 1/20* (2006.01)
*H01L 23/473* (2006.01)

(52) U.S. Cl.
CPC ............. *G06F 1/20* (2013.01); *H05K 7/2039* (2013.01); *H05K 7/20336* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 2003/0076657 A1* | 4/2003 | Summers | H01L 23/4093 361/719 |
| 2004/0095201 A1* | 5/2004 | Song | H01L 23/48 333/24 R |
| 2006/0056154 A1* | 3/2006 | Foster | G06F 1/185 361/700 |
| 2007/0070607 A1* | 3/2007 | Goodwin | H01L 23/367 361/719 |
| 2007/0201208 A1* | 8/2007 | Goodwin | G06F 1/20 361/701 |
| 2007/0263359 A1* | 11/2007 | Lai | H01L 23/3672 361/715 |
| 2008/0089034 A1* | 4/2008 | Hoss | G06F 1/20 361/721 |
| 2008/0101035 A1* | 5/2008 | Chen | H01L 23/4093 361/720 |
| 2009/0002951 A1* | 1/2009 | Legen | F28D 15/0275 361/715 |
| 2009/0168356 A1* | 7/2009 | Chen | H01L 23/427 361/709 |
| 2009/0257197 A1* | 10/2009 | Yang | H01L 23/4093 361/720 |
| 2009/0268408 A1* | 10/2009 | Liu | G06F 1/20 361/710 |
| 2009/0277616 A1* | 11/2009 | Cipolla | F28D 15/0233 165/104.33 |

(Continued)

*Primary Examiner* — Anthony Haughton
*Assistant Examiner* — Razmeen Gafur
(74) *Attorney, Agent, or Firm* — Corsair Memory, Inc.

(57) ABSTRACT

At least one hollow metal body with a plurality of micro heat pipes embedded in the hollow metal body is used as a heat sink to remove heat from memory chips in a memory device.

5 Claims, 1 Drawing Sheet

(56) References Cited

U.S. PATENT DOCUMENTS

| | | | | |
|---|---|---|---|---|
| 2009/0316352 A1* | 12/2009 | Zhu | G11C 5/04 | 361/679.54 |
| 2010/0085712 A1* | 4/2010 | Hrehor, Jr. | H05K 7/20254 | 361/699 |
| 2010/0172088 A1* | 7/2010 | Lian | G06F 1/20 | 361/679.47 |
| 2011/0032672 A1* | 2/2011 | Artman | G06F 1/20 | 361/679.47 |
| 2011/0279969 A1* | 11/2011 | Memon | G06F 1/20 | 361/679.47 |
| 2011/0310563 A1* | 12/2011 | Meyer, IV | F28D 15/0233 | 361/704 |
| 2011/0310565 A1* | 12/2011 | He | G06F 1/20 | 361/715 |
| 2013/0016477 A1* | 1/2013 | Yokoya | H01L 23/36 | 361/719 |
| 2013/0119527 A1* | 5/2013 | Luo | H01L 23/36 | 257/690 |
| 2013/0194745 A1* | 8/2013 | Meijer | G06F 1/20 | 361/679.47 |
| 2013/0329352 A1* | 12/2013 | Nigen | H05K 7/205 | 361/679.31 |
| 2014/0218861 A1* | 8/2014 | Shelnutt | G06F 1/20 | 361/679.53 |

* cited by examiner

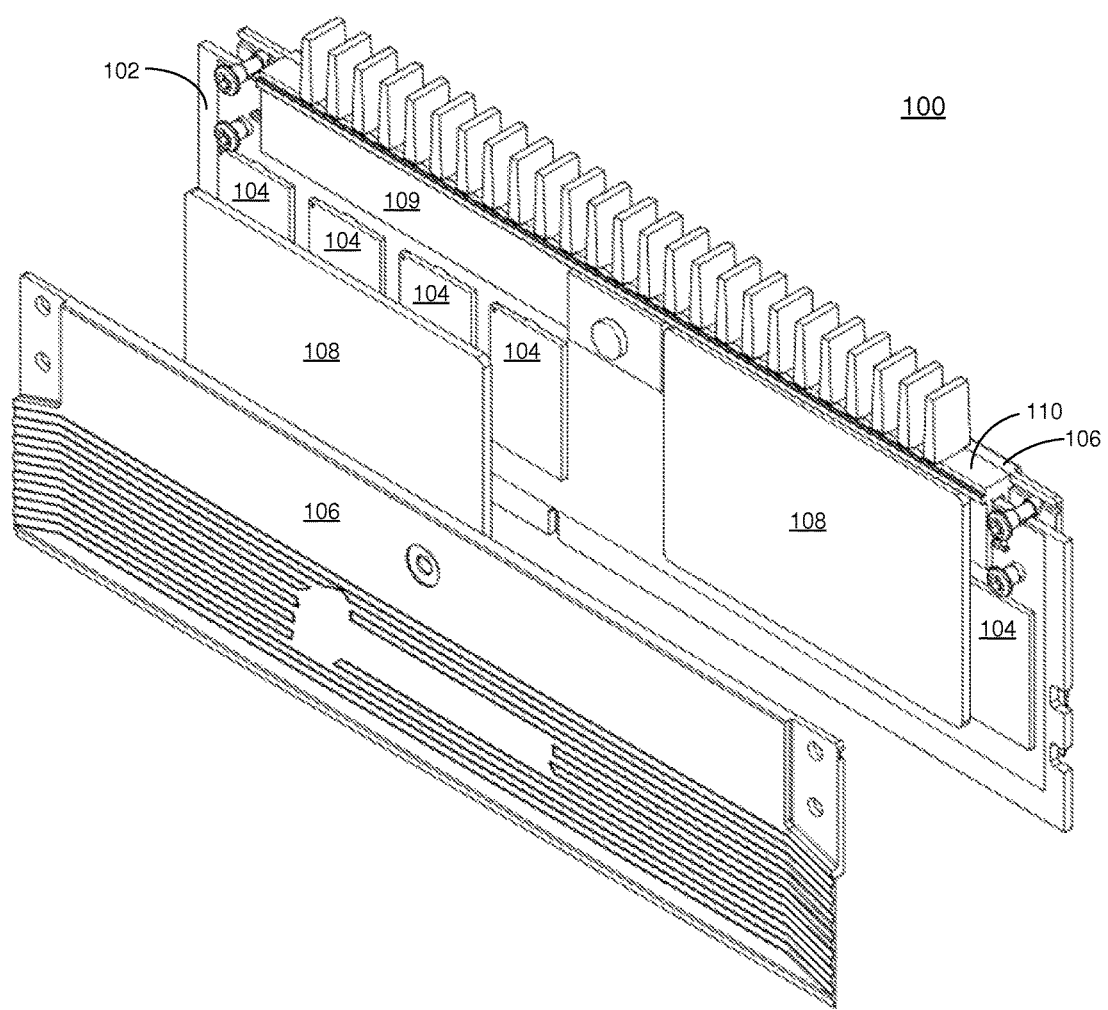

MICRO HEAT PIPE COOLING SYSTEM

TECHNICAL FIELD

The disclosed embodiments relate generally to cooling systems. More particularly, the disclosed embodiments relate to methods, systems for cooling a computer memory device.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the FIGURES.

The FIGURE is a high-level block diagram that illustrates micro heat pipe heat sinks for conducting heat away from memory chips, according to certain embodiments.

DESCRIPTION OF EMBODIMENTS

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

According to certain embodiments, at least one hollow metal body with a plurality of micro heat pipes embedded in the hollow metal body is used as a heat sink to remove heat from memory chips in a memory device.

According to certain embodiments, the at least one hollow metal body with the plurality of embedded micro heat pipes are arranged on the memory chips of the memory device such that the length of an embedded micro heat pipe of the plurality of embedded micro heat pipes run along the minor axis of the PCB (printed circuit board) plane of the memory device on which the memory chips are located. According to certain embodiments, the at least one hollow metal body and the micro heat pipes are made of a thermally conductive material. For purposes of explanation, the at least one hollow metal body with the plurality of embedded micro heat pipes is herein referred to as a "micro heat pipe heat sink."

According to certain embodiments, the embedded micro heat pipes contain a fluid that has suitable thermal properties such that the micro heat pipe heat sink has a high thermal conductivity (low thermal resistance). For example, a fluid with a low boiling point can be used. A non-limiting example of such a fluid is acetone. Further, according to certain embodiments, the micro heat pipe heat sink has a large surface area relative to the surface area each memory chip to enable rapid transfer of thermal energy from the memory chips.

According to certain embodiments, the micro heat pipe heat sink, in turn, transfers at least some of the heat that is removed from the memory chips to one or more other heat sinks or heat spreaders that transfer the heat to the surrounding air. As a non-limiting example, the one or more other heat sinks or heat spreaders include a pair of side plates that form the outer covering of the memory device. According to certain embodiments, the side plates are made of a thermally conductive material. As another non-limiting example, the one or more other heat sinks or heat spreaders include a finned structure on top of the PCB plane of the memory device. According to certain embodiments, the finned structure is made of a thermally conductive material.

The FIGURE is a high-level block diagram that illustrates a memory device, according to certain embodiments. The FIGURE shows a memory device 100 that includes a PCB 102, a plurality of memory chips 104 on one side of PCB 102, one or more micro heat pipe heat sinks 108, side plates 106, and finned heat spreader 110. Even though two micro heat pipe heat sinks are shown in The FIGURE, the embodiments are not limited to two micro heat pipe heat sinks nor do the embodiments require two micro heat pipe heat sinks. For example, certain embodiments may have only one micro heat pipe heat sink. Certain other embodiments may have more than two micro heat pipe heat sinks. Further, there may be a plurality of memory chips on the flip side (not shown in The FIGURE) of PCB 102. Thus, as in the case of a double-sided memory device, there may be one or more micro heat pipe heat sinks on the flip side of PCB 102 to remove heat from a plurality of memory chips located on the flip side of PCB 102, for example.

According to certain embodiments, finned heat spreader 110 is connected to a ground plane of PCB 102. According to certain other embodiments, finned heat spreader 110 may be free floating on top of PCB 102 and not connected to PCB 102. At least a portion of each micro heat pipe heat sinks 108 is in contact with the finned heat spreader 110 through a thermal interface 109 of the finned heat spreader 110 to transfer at least some of the heat that is removed from the memory chips to the surrounding air. For example, one or more fans (not shown in The FIGURE) can blow air onto the fins of finned heat spreader 110 to carry the heat away from the memory device. According to certain embodiments, the micro heat pipe heat sinks 108 can be glued or soldered to side plates 106. Side plates 106 protect micro heat pipe heat sinks 108 and can act as heat sinks themselves to transfer heat to the surrounding air. Additionally, side plates 106 can provide cosmetic enhancements to the memory device.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

The invention claimed is:

1. A system for cooling a memory device, the system comprising:
   one or more thermally conductive bodies in which are embedded a plurality of micro heat pipes;

wherein,
the one or more thermally conductive bodies are arranged on one or more memory chips of the memory device such that the embedded micro heat pipes run lengthwise along a minor axis of a PCB plane of the memory device; and
the one or more thermally conductive bodies are in contact with at least one finned heat spreader to transfer at least some of the heat from the one or more thermally conductive bodies to air surrounding the memory device, wherein at least a portion of each micro heat pipe of the plurality of micro heat pipes is in contact with the at least one finned heat spreader.

2. The system of claim 1, wherein the at least one heat spreader is connected to a ground plane of the PCB of the memory device.

3. The system of claim 1, wherein the at least one heat spreader is free floating on top of the PCB of the memory device.

4. The system of claim 1, wherein the embedded micro heat pipes contain a fluid having a low boiling point.

5. The system of claim 1, wherein the one or more thermally conductive bodies on each side of a double sided memory device are attached to a side plate of the double sided memory device.

\* \* \* \* \*